(12) United States Patent
Weber et al.

(10) Patent No.: US 8,172,941 B2
(45) Date of Patent: May 8, 2012

(54) METHOD AND DEVICE FOR PRODUCING SEMICONDUCTOR WAFERS OF SILICON

(75) Inventors: Martin Weber, Kastl (DE); Herbert Schmidt, Halsbach (DE); Wilfried von Ammon, Hochburg/Ach (AT)

(73) Assignee: Siltronic AG, Munich (DE)

( * ) Notice: Subject to any disclaimer, the term of this patent is extended or adjusted under 35 U.S.C. 154(b) by 1165 days.

(21) Appl. No.: 12/002,881

(22) Filed: Dec. 19, 2007

(65) Prior Publication Data

US 2008/0153261 A1    Jun. 26, 2008

(30) Foreign Application Priority Data

Dec. 20, 2006   (DE) .......................... 10 2006 060 359

(51) Int. Cl.
C30B 15/00 (2006.01)
C30B 21/06 (2006.01)
C30B 27/02 (2006.01)
C30B 28/10 (2006.01)
C30B 30/04 (2006.01)

(52) U.S. Cl. ... 117/13; 117/204; 117/208; 257/E21.599; 438/460

(58) Field of Classification Search .................... 117/13, 117/204, 208
See application file for complete search history.

(56) References Cited

U.S. PATENT DOCUMENTS

| 5,567,399 | A |    | 10/1996 | Von Ammon et al. |         |
|-----------|---|----|---------|------------------|---------|
| 5,954,873 | A | *  | 9/1999  | Hourai et al.    | 117/13  |
| 6,048,779 | A |    | 4/2000  | Watanabe et al.  |         |
| 6,113,688 | A | *  | 9/2000  | Kawanishi et al. | 117/30  |
| 7,223,304 | B2| *  | 5/2007  | Lu               | 117/30  |
| 7,329,317 | B2| *  | 2/2008  | Maeda et al.     | 117/13  |
| 2002/0092461 | A1 | * | 7/2002 | Virbulis et al. | 117/13  |
| 2004/0192015 | A1 | * | 9/2004 | Ammon et al.    | 438/502 |
| 2006/0005762 | A1 | * | 1/2006 | Maeda et al.    | 117/13  |
| 2006/0144321 | A1 | * | 7/2006 | Lu              | 117/30  |

(Continued)

FOREIGN PATENT DOCUMENTS

DE            103 39 792 A1    10/2004
(Continued)

OTHER PUBLICATIONS

Watanabe, M. et al., "Direct Observation and Numerical Simulation of Molten Silicon Flow during Crystal Growth under Magnetic Fields by X-Ray Radiography and Large-Scale Computation", Progress in Crystal Growth and Characterization of Materials vol. 38 pp. 215-238 (1999).*

(Continued)

*Primary Examiner* — Shuangyi Abu Ali
*Assistant Examiner* — Ross J Christe
(74) *Attorney, Agent, or Firm* — Brooks Kushman P.C.

(57) ABSTRACT

Semiconductor wafers of silicon are produced by pulling a single crystal from a melt contained in a crucible and slicing semiconductor wafers from the pulled single crystal, heat being delivered to a center of the growing single crystal at the boundary with the melt during the pulling of the single crystal, a CUSP magnetic field applied such that a neutral surface of the CUSP magnetic field intersects a pulling axis of the single crystal at a distance of at least 50 mm from a surface of the melt. An apparatus suitable therefore contains a CUSP field positioned such that a neutral field intersects the axis of the crystal in the crucible 50 mm or more from the melt surface.

13 Claims, 5 Drawing Sheets

U.S. PATENT DOCUMENTS

| | | | |
|---|---|---|---|
| 2006/0283379 A1* | 12/2006 | Inami et al. | 117/43 |
| 2006/0292890 A1* | 12/2006 | Ammon et al. | 438/770 |
| 2007/0227442 A1* | 10/2007 | Lu | 117/208 |
| 2008/0053372 A1* | 3/2008 | Anttila et al. | 117/200 |
| 2008/0187736 A1* | 8/2008 | Sattler et al. | 428/220 |

FOREIGN PATENT DOCUMENTS

| | | |
|---|---|---|
| EP | 725169 A1 | 8/1986 |
| JP | 61-222984 | 10/1986 |
| JP | 8-239291 | 9/1996 |
| JP | 2000239097 A | 9/2000 |
| JP | 2004292309 A | 10/2004 |
| JP | 2005330147 A | 12/2005 |
| WO | 2006/073614 A1 | 7/2006 |

OTHER PUBLICATIONS

Kakimoto, K. et al., "Mechanism of Heat and Oxygen Transfer under Electromagnetic CZ Crystal Growth with Cusp-Shaped Magnetic Fields", Journal of the Electrochemical Society vol. 150 pp. G648-G652 (2003).*

Kakimoto, K. et al. "Use of an Inhomogeneous Magnetic Field for Silicon Crystal Growth", Journal of Crystal Growth vol. 180 pp. 442-449 (1997).*

Tomzig, Erich et al., "Challenges for Economic Growth of High Quality 300 mm CZ Si Crystals", Microelectronic Engineering, vol. 45, pp. 113-125 (1999).*

Watanbe, M.; Eguchi, M.; Hibiya, T.: Flow and temperature field in molten silicon during Czochralski crystal growth in a cusp magnetic field; Journal of Crystal Growth, 1998, vol. 193, s. 402-412.

* cited by examiner

METHOD AND DEVICE FOR PRODUCING SEMICONDUCTOR WAFERS OF SILICON

BACKGROUND OF THE INVENTION

1. Field of the Invention

The invention relates to a method for producing semiconductor wafers of silicon, comprising the pulling of a single crystal from a melt contained in a crucible and the slicing of semiconductor wafers from the pulled single crystal, heat being delivered to a center of the growing single crystal at the boundary with the melt during the pulling of the single crystal, and a CUSP magnetic field being applied to the melt. The invention also relates to a device for carrying out the method.

2. Background Art

Growth of single crystals according to the Czochralski method where the melt is exposed to a magnetic field is known as the MCZ method. Magnetic fields have been used for a long time to influence melt flows. In the industrial fabrication of silicon single crystals, horizontal magnetic fields or so-called CUSP fields are used particularly often. JP 61-222984 claims a device for pulling single crystals according to the Czochralski method while imposing a static magnetic field in the melt, which optimizes the temperature distribution in the melt and dampens convection. The CUSP magnetic field is generated by mutually opposite magnetic coils with the same polarity, which are arranged coaxially with the pulling axis of the single crystal.

DE 103 39 792 A1 describes MCZ methods for producing single crystals of silicon, which are optimized with respect to their defect properties. The focus of attention is on intrinsic point defects and their aggregates, as well as on the Voronkov model which allows predictions regarding the formation of such defects. In the case of intrinsic point defects, distinction is made between interstitial silicon atoms (interstitials) and vacancies. If point defects enter supersaturation when the single crystal is being cooled, then silicon interstitials will form aggregates which can be detected in the form of dislocation loops (A-swirl defects, LPITs) and smaller clusters (B-swirl defects). In the event of supersaturation, vacancies form vacancy aggregates (voids) which, depending on the detection method, are referred to, inter alia, as COP defects (crystal originated particles), FPDs (flow pattern defects), LLSs (localized light scatterers) or DSODs (direct surface oxide defects).

It is necessary to ensure that the semiconductor wafers of silicon have no A-swirl defects in the region relevant for producing the components, and that they are as free as possible of COP defects whose size lies in the range of the structure widths of the components or higher. Semiconductor wafers which fulfill these requirements are often referred to as defect-free or perfect, even though their crystal lattice generally contains smaller COP defects or B-swirl defects, or both types of defects.

According to the Voronkov model, that intrinsic point defect type which is incorporated in excess into the crystal lattice when pulling the single crystal depends essentially on the ratio of the pulling rate V, at which the single crystal is pulled from the melt, and the temperature gradient G perpendicular to the phase boundary between the growing single crystal and the melt. If the ratio falls below a critical ratio, then an excess of silicon interstitials is created. If the critical ratio is exceeded, then the vacancies predominate. If there is an excess of vacancies, the size of the COP defects being formed depends essentially on two process parameters, namely the aforementioned ratio V/G and the rate at which the single crystal is cooled in the range of from approximately 1100° C. to 1000° C., the nucleation temperature of voids. The COP defects are therefore commensurately smaller as the ratio V/G lies closer to the critical ratio and the faster the single crystal is cooled in the cited temperature range. In practice, attempts are therefore made to control the two process parameters when pulling the single crystal, so that the defects created by supersaturation of vacancies remain small enough not to interfere with the production of electronic components. Since the structure widths of the components decrease with each generation, the defect size which can still be tolerated decreases accordingly.

Owing to corrosion of the quartz crucible, oxygen will enter the melt. The oxygen forms small precipitates in the single crystal which are termed as grown bulk micro defects or "BMDs". These are desirable to a certain extent because they can keep metallic impurities lying in the interior (bulk) of the silicon wafer away from the surface (gettering).

If the single crystal is pulled under conditions in which the ratio V/G lies only slightly above the critical ratio, then the interaction of vacancies and oxygen atoms also forms seeds, which give rise to OSF defects (oxidation induced stacking faults). The presence of a zone with such seeds (OSF zone) is usually detected by subjecting a semiconductor wafer, sliced from the single crystal, to oxidation in wet oxygen at about 1000° C. for a few hours so that OSF defects are formed. Since this defect type is likewise detrimental to the functional integrity of electronic components, endeavors are made to suppress their formation, for example by reducing the concentration of oxygen in the melt so that less oxygen is incorporated into the single crystal than would be necessary in order to form OSF defects. The OSF zone can also be avoided by modifying V/G, for example by using higher or lower pulling rates. The formation of OSF seeds can furthermore be reduced by higher cooling rates (in the temperature range of the precipitation at 900° C.).

In the context of the invention, semiconductor wafers of silicon are referred to as low-defect if no OSF defects are detectable and at least 75% of the surface is essentially free of A-swirl defects and COP defects with a size greater than 30 nm.

Particular difficulties in controlling the ratio V/G result from the fact that the single crystal usually cools faster at the edge than at the center, so that the ratio V/G decreases from the center toward the edge. Despite corresponding control, this can lead to unacceptably large COP defects being formed at the center and/or A-swirl defects in the edge region. The dependency of G on the radial position r, i.e. G(r), must therefore be taken into account especially when semiconductor wafers of silicon with a diameter of 200 mm, 300 mm or more are intended to be produced. Variations in V/G as a function of the amount of melt crystallized must likewise be taken into account.

In order to restrict radial variations in the axial temperature gradient G at the phase boundary, the aforementioned DE 103 39 792 A1 proposes to induce a melt flow directed toward the center of the phase boundary. This is achieved, for example, by co-rotating the single crystal and the crucible and applying a CUSP magnetic field to the melt. The heat thereby supplied to the center of the single crystal increases the axial temperature gradient there and equalizes its radial profile. It has however been found that these measures of radially homogenizing G are not on their own sufficient to achieve high yields of low-defect semiconductor wafers. For instance, it is often found in particular that semiconductor wafers of rapidly pulled single crystals have a wide zone with unacceptably large COP defects at their center.

SUMMARY OF THE INVENTION

It was therefore an object to develop an MCZ method with which low-defect semiconductor wafers can be produced with an improved yield. These and other objects are achieved by directing heat to the center of the growing crystal at the boundary of the melt, a CUSP field applied such that a neutral surface of the field intersects the pulling axis at a distance of at least 50 mm from a surface of the melt.

BRIEF DESCRIPTION OF THE DRAWINGS

FIG. 4 shows a preferred pulling device with which single crystals, which provide low-defect semiconductor wafers with high yields, can be pulled from a melt even by using comparatively high pulling rates of up to more than 0.55 mm/min in the direction a.

DETAILED DESCRIPTION OF THE PREFERRED EMBODIMENT(S)

The invention thus relates to a method for producing semiconductor wafers of silicon, comprising the pulling of a single crystal from a melt contained in a crucible and the slicing of semiconductor wafers from the pulled single crystal, heat being delivered to a center of the growing single crystal at the boundary with the melt during the pulling of the single crystal, a CUSP magnetic field being applied to the melt so that a neutral surface of the CUSP magnetic field intersects a pulling axis of the single crystal at a distance of at least 50 mm from the surface of the melt.

The method improves in particular the yield of low-defect semiconductor wafers of silicon with a diameter of 300 mm or more. This applies especially when pulling is carried out with comparatively high pulling rates of more than 0.35 mm/min. Especially for these cases, the method provides a way in which a zone with large COP defects at the center of the silicon wafer can be reduced or avoided.

By intensive studies, the inventors have established that the radial profile of the ratio V/G can be equalized more effectively when the neutral surface of the CUSP magnetic field is placed as far as possible above the surface of the melt. Owing to this measure, the melt flow transporting heat toward the center of the phase boundary remains focused more strongly onto this center. However, it has also been found that the neutral plane cannot be moved arbitrarily far upward because the temperature gradient between the edge of the single crystal and the adjoining melt then also becomes flatter. Moreover, if the temperature gradient becomes too small, then the single crystal starts to grow in a non-round fashion. It is therefore preferable to place the neutral surface of the CUSP magnetic field so that it intersects the pulling axis of the single crystal at a distance from the surface of the melt which lies in the range of from 50 to 150 mm, more preferably in the range of from 80 to 140 mm. The position of the neutral surface can be controlled via the horizontal arrangement of the magnetic coils and via the ratio of the field strengths of the fields of the upper and lower magnetic coils. For example, the neutral surface lies commensurately further away from the surface of the melt when the distance from the upper magnetic field coil to the surface of the melt is greater and when the field strength of the field of the upper magnetic coil is smaller in relation to the lower magnetic field coil. The neutral surface of the CUSP magnetic field denotes the positions between the magnetic field coils where the axial component of the CUSP magnetic field is zero.

Figure 1A:
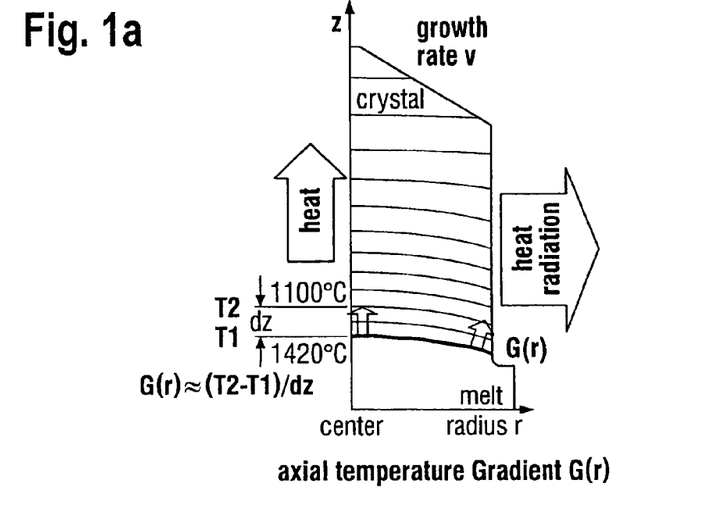
FIG. 1a schematically depicts the temperature distribution in a single crystal pulled from the melt.

FIG. 1a schematically depicts the temperature distribution in a single crystal pulled from the melt. The spacing of the isotherms in the vicinity of the phase boundary reflects the axial temperature gradient G, whose radial variation G(r) is of great importance for the defect formation. Conventionally the temperature gradient is very high at the crystal edge owing to the large amount of radiation emitted, so that the single crystal cools rapidly (temperature decrease per length).

Figure 1B:
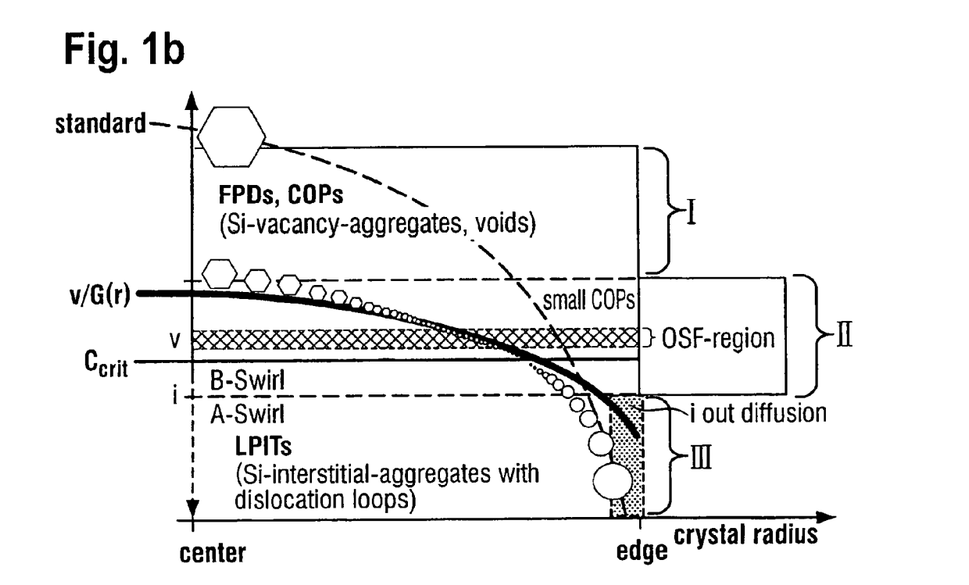
FIG. 1b shows the radial defect distribution to be expected according to the Voronkov model, which is determined essentially by the value of the ratio, represented by the ordinate, of the pulling rate V and the axial temperature gradient G at the phase boundary.

FIG. 1b shows the radial defect distribution to be expected according to the Voronkov model, which is determined essentially by the value of the ratio, represented by the ordinate, of the pulling rate V and the axial temperature gradient G at the phase boundary. If this value lies in the region denoted by II while the single crystal is being pulled, then the single crystal and the semiconductor wafers sliced from it will be free of A-swirl defects and large COP defects. The upper boundary of the region II denotes the lowest V/G ratio, above which aggregates of vacancies will be formed which are larger than 30 nm. Below this boundary, only small COP defects are formed. The lower boundary of the region II denotes the highest V/G ratio, below which A-swirl defects will be formed. Above this boundary, only B-swirl defects are still formed. Between the upper boundary and the boundary marked by $C_{crit}$ lies the OSF zone, in which OSF defects will be detectable if no measures are implemented to limit the incorporation of oxygen into the single crystal. The boundary marked by $C_{crit}$ denotes the V/G ratio at which neither vacancies nor silicon interstitials are present in excess.

The method according to the invention serves to obtain as many low-defect semiconductor wafers as possible from a single crystal with a selected ratio V/G. The radial profile of V/G must therefore be homogenized so that the ratio does not lie in the region of the formation of A-swirl defects (region III) and also as far as possible not in the region of the formation of large COP defects (region I). According to the invention, this is achieved by applying a CUSP magnetic field to the melt, the neutral surface of which lies at a distance of at least 50 mm from the surface of the melt where it intersects the pulling axis.

Figure 2:
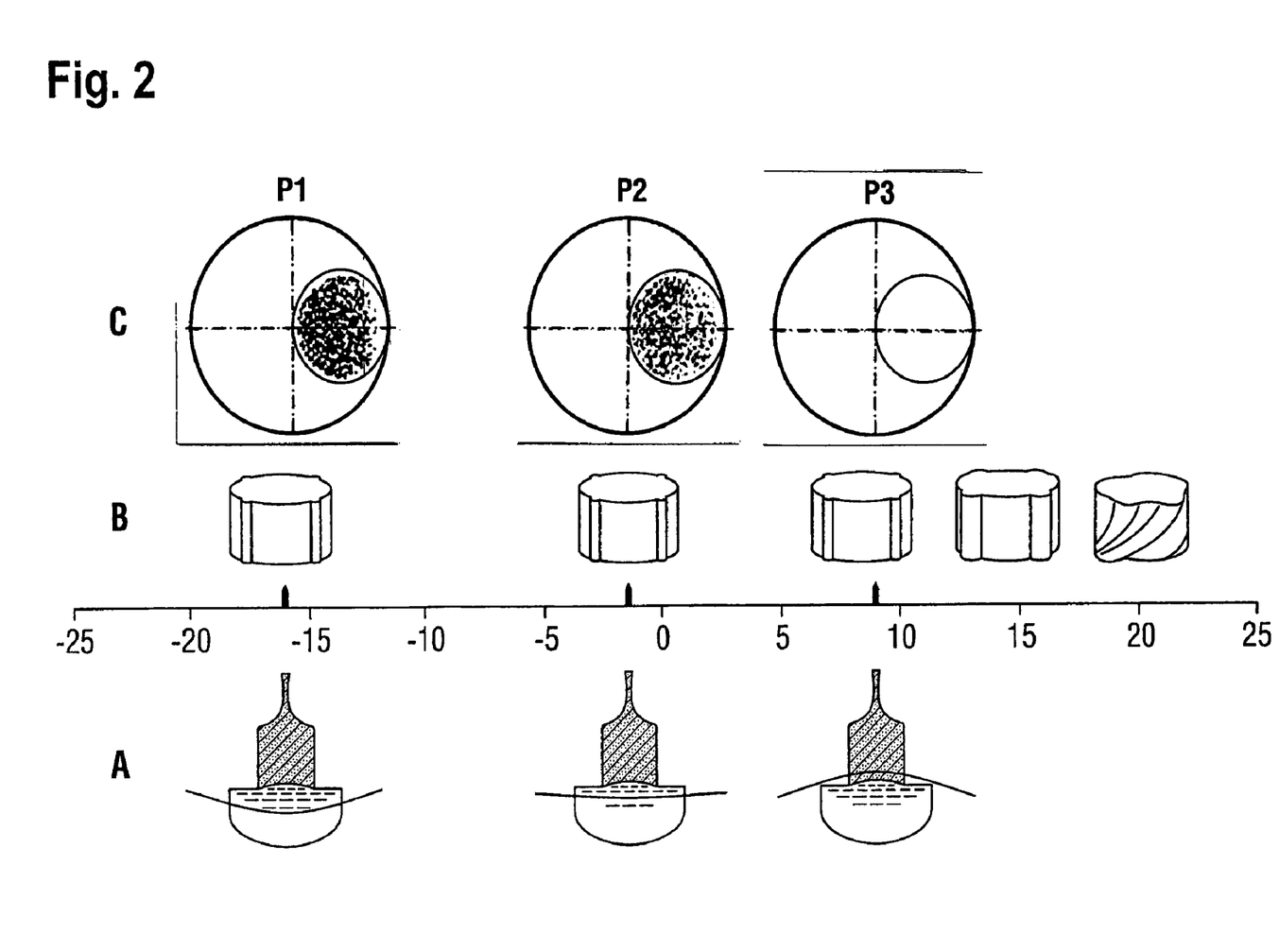
FIG. 2 schematically shows the relationship between the axial position of the neutral surface and the formation of COP defects with a size of more than 30 nm for pulling rates of about 0.38 mm/min.

FIG. 2 schematically shows the relationship between the axial position of the neutral surface and the formation of COP defects with a size of more than 30 nm for pulling rates of about 0.38 mm/min. If the neutral surface intersects the pulling axis below the surface of the melt, i.e. at a position which is less than 0 on the scale shown, unacceptably large and unacceptably many COP defects will be detected. This is still the case if the intersection point lies in the region of the surface of the melt. Only if the intersection point is raised in the scope of the invention, so that the supply of heat is concentrated better onto the center of the single crystal, will the number of large COP defects be significantly reduced. If the neutral surface lies more than approximately 150 mm above the surface of the melt, then the single crystal will no longer grow in a round fashion.

Preferred embodiments of the method provide one or more additional measures for radially homogenizing the axial temperature gradient G. One of these is that the single crystal and the crucible containing the melt are co-rotated while the single crystal is being pulled, and the single crystal is rotated more rapidly than the crucible. When pulling a single crystal in order to produce semiconductor wafers with a diameter of 300 mm, it has proven particularly favorable for the rotation speed of the single crystal to lie in the range of from 6 to 10 rpm and for that of the crucible to lie in the range of from 1 to 4 rpm. As large as possible a difference between the rotation speeds is particularly preferred in this case. However, the single crystal also should not be rotated too rapidly because otherwise it will be deformed, i.e. become non-round, which will entail great difficulties or losses in the further processing to form silicon wafers. Another additional method consists in the distance at which a conventional heat shield, surrounding the single crystal, lies from the surface of the melt being at least 10 mm, preferably from 25 to 50 nm. Furthermore an annular heat source may additionally be used, for example such as is described in the previously cited DE 103 39 792 A1, in order to heat the single crystal's edge adjoining the surface of the melt. In this way it is possible for the heat input in the outer region of the solidifying single crystal, and therefore the axial temperature gradient G in this region, to be controlled very accurately and adapted to varying thermal conditions, which cannot be done via the distance between the heat shield and the melt surface, or can be done thereby only with difficulty. Such a controlled heat supply in the edge region of the single crystal is expedient because the geometrical and therefore thermal conditions vary with the length of the single crystal and the decreasing amount of melt.

Preferred embodiments of the method also provide one or more additional measures for controlling the axial gradient G, in order to be able to produce low-defect semiconductor wafers with high productivity. To this end, according to the Voronkov model, the rate V and the axial temperature gradient G must be raised uniformly when the single crystal is being pulled. In general, an increase in the temperature gradient is achieved by stronger cooling of the single crystal, for example by using heat shields and coolers which surround the single crystal. Unfortunately, the radial profile of the temperature gradient G(r) becomes more inhomogeneous as a result of the cooling and the higher pulling rates. In order to be able to operate with particularly high pulling rates, heat should therefore be delivered as intensively as possible from the melt toward the center of the growing single crystal. The heat transport takes place essentially by a melt flow directed from the crucible bottom toward the center of the phase boundary. A smaller proportion may also be introduced directly via thermal conduction. The additionally required heat is preferably provided by at least one heat source heating the central region of the crucible bottom.

In order to achieve particularly high pulling rates, it is preferable to use a mobile heat source which is raised with the crucible while the single crystal is being pulled, and which heats a centrally lying region of the crucible bottom. Owing to the fact that the heat source is raised with the crucible, additional heating power is not required because it is not necessary to compensate for a power loss due to an increasing distance between the heat source and the crucible bottom. The centered geometrical arrangement of the heat source at the crucible bottom assists of the formation of the central melt flow, which transports heat. In addition or as an alternative to this, the crucible bottom may be heated with the aid of a heat source which is arranged statically below the crucible, and which is therefore not lifted together with the crucible while the single crystal is being pulled. Together with a conventional lateral heater, which surrounds the crucible, heat is thus preferably delivered to the single crystal and to the melt in various ways. In order to produce low-defect semiconductor wafers having diameters of 300 mm with high productivity, the heating power is preferably divided between the heat sources in the following way. The heating power of the lateral heater lies in the range of from 75% to 85%, that of the annular heat source from 6% to 12%, that of the static heat source in the range of from 5% to 10% and that of the mobile heat source in the range of from 4% to 8% of the total power. The region in the crucible bottom, to which additional heat is applied, preferably has a diameter of at most one half of the crystal diameter. The temperature distribution should be rotationally symmetric in said region.

In order to achieve medium pulling rates, which lie in the range of from 0.35 to 0.55 mm/min with single crystals of silicon for semiconductor wafers having a diameter of 300 mm, the mobile heat source may be omitted. The heating power of the lateral heater in this case preferably lies in the range of from 60 to 80%, that of the annular heat source from 10% to 20% and that of the static heat source in the range of from 10% to 20% of the total power.

Conventionally, the heating power of the lateral heater is controlled over the length of the single crystal so that the desired pulling rate and the crystal diameter can simultaneously be achieved and maintained.

Heat is preferably also extracted from the single crystal by cooling. In this way, the total cooling rate of the single crystal is influenced and the axial temperature gradient G is increased overall. The nucleation of vacancy aggregates in the temperature range relevant therefor (melting point up to about 1000° C.) is furthermore influenced. The higher the cooling rate, the smaller is the size of the COPs which are formed. In particular a water-cooled heat exchanger, which is arranged around the single crystal and comprises safety features as described in EP 725169 A1, is suitable for effective cooling. Its inner surface facing the single crystal is preferably blackened so that as little radiative heat as possible is reflected toward the single crystal. The emissivity $\epsilon$ of the inner surface is preferably at least 0.75. The inner surface facing the single crystal has an area of at least 2500 $cm^2$.

Preferred embodiments of the method also provide one or more measures for controlling the oxygen concentration in the single crystal. The oxygen concentration in the single crystal should be controlled, and preferably low enough so that no OSF defects are formed even when the single crystal is pulled with a ratio V/G which, according to the Voronkov model, would be conducive to the formation of such defects. On the other hand, there should also preferably be enough oxygen so that sufficient nucleation centers are present for the oxygen precipitates. It is known that the formation of nucleation centers for oxygen precipitates, and in turn the getterability, can be increased by additionally doping with nitrogen and/or carbon. Optionally, therefore, doping may additionally be carried out with nitrogen and/or carbon so long as this does not lead to the formation of OSF defects. It is furthermore known that the range within which V/G may vary during the production of low-defect semiconductor wafers is greater when the single crystal is additionally doped with nitrogen, carbon or hydrogen or a combination of these elements. As regards the oxygen concentration, a concentration according to ASTM Standard F121-83, preferably in the range of from $5 \times 10^{17}$ atoms/cm$^3$ to $6.5 \times 10^{17}$ atoms/cm$^3$, is desirable if additional doping with nitrogen and/or carbon is not intended.

The oxygen concentration is preferably controlled via the field strength generated by the magnetic coils, via the pressure in the pulling system and via the throughput per unit time with which an inert gas, for example argon, is fed through the pulling system. The oxygen content in the single crystal is dependent on the melt flows. With co-rotation of the single crystal and the crucible, for example, increased crucible rotation leads to a lower oxygen content. Field strengths of from at least 10 mT (7960 A/m) to 80 mT (63,700 A/m) in the region of the pulling axis in the melt, and a pressure-throughput ratio of from 0.004 to 0.03 mbar/(l/h) are particularly preferred. If the field strength is too low, then the effect delivering the melt flow toward the center of the phase boundary will be lost, the melt flow will diverge and its homogenizing effect will no longer be exerted in the central region of the phase boundary.

Figure 3A:
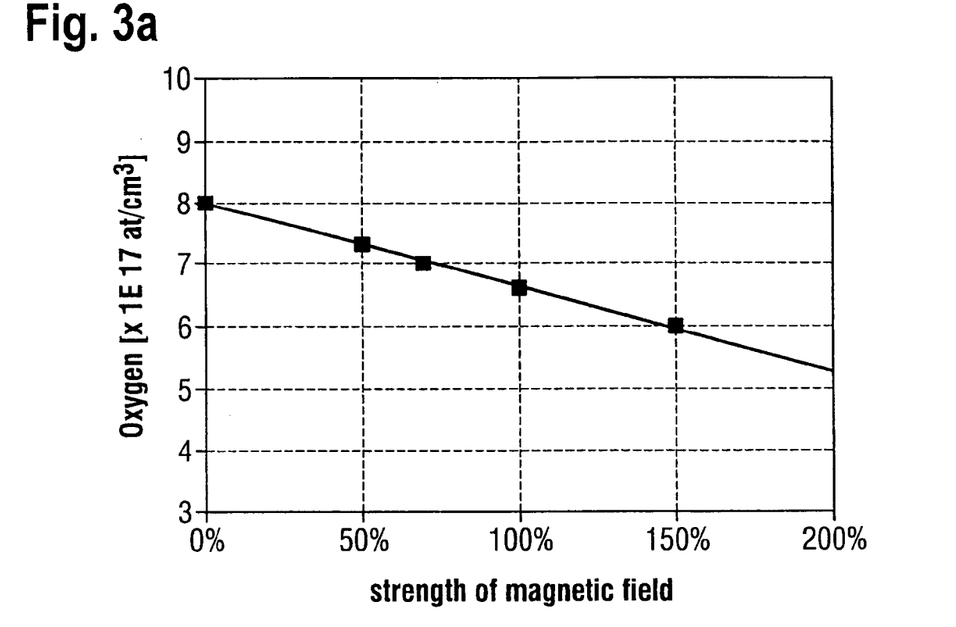
FIGS. 3a and 3b represent the influence which the field strength of the CUSP magnetic field and the crucible rotation with co-rotation of the single crystal have on the oxygen concentration in the single crystal.
Figure 3B:
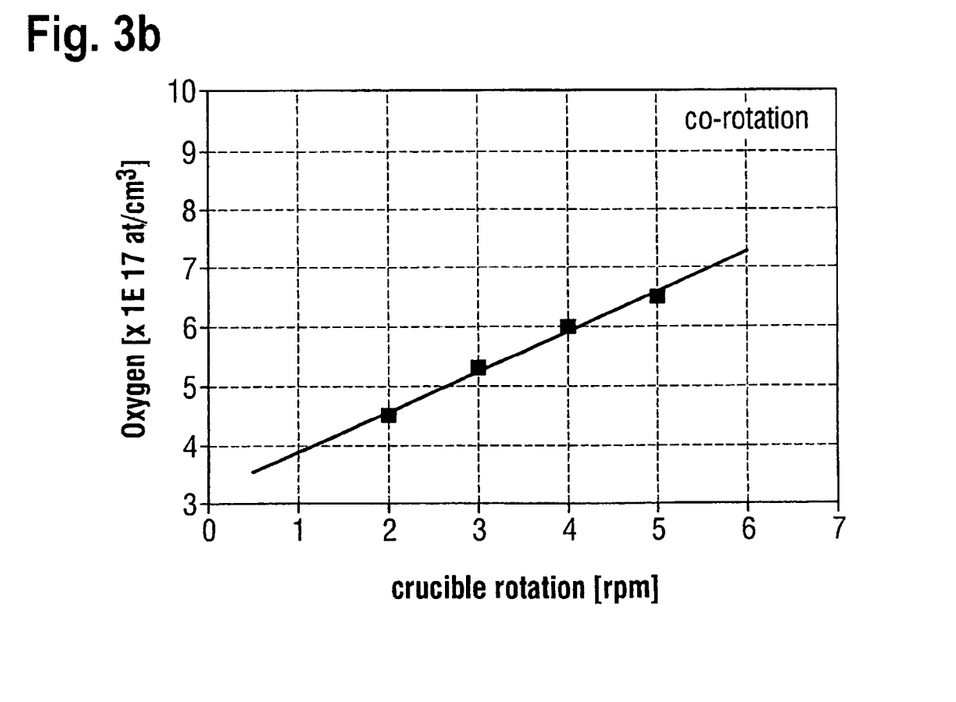

FIGS. 3a and 3b represent the influence which the field strength of the CUSP magnetic field and the crucible rotation with co-rotation of the single crystal have on the oxygen concentration in the single crystal. Although the ratio of pressure to throughput co-determines the oxygen content, it must however also be selected so as to guarantee effective transport of the particles and condensates out of the gas space above the crucible. Otherwise particles may enter the melt and reach the phase boundary, and cause crystal dislocations there. The production of low-defect single crystals having diameters of at least 300 mm with high pulling rates is preferably carried out at a high pressure of at least 40 mbar, more preferably at least 80 mbar. In this way the cooling rate in the temperature range of the nucleation of vacancy aggregates may also be increased somewhat, so that even smaller defects are formed.

Figure 4:
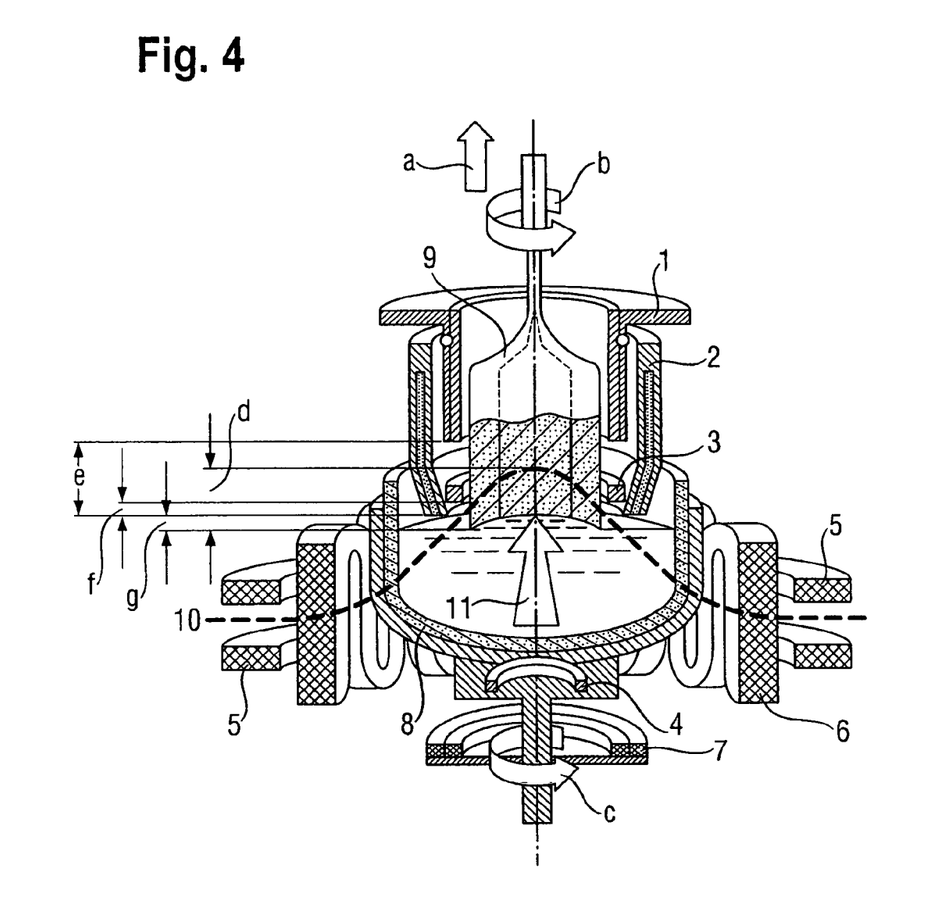

FIG. 4 shows a preferred pulling device with which single crystals, which provide low-defect semiconductor wafers with high yields, can be pulled from a melt even by using comparatively high pulling rates of up to more than 0.55 mm/min in the direction a. The single crystal and the crucible are rotated in co-rotation directions b and c. The device comprises a crucible 8 which contains a melt and is surrounded by a lateral heater 6. The single crystal 9 pulled from the melt is screened against radiative heat by a heat shield 2 surrounding it. The CUSP magnetic field is generated by two mutually opposite magnetic field coils 5, which are arranged coaxially with the crucible and the pulling axis of the single crystal. The neutral surface 10 of the CUSP magnetic field intersects the pulling axis at a distance d from the surface of the melt. The distance is from 50 to 150 mm. The pulling device furthermore comprises a bottom heater 4, raisable with the crucible, which delivers heat that is transported by the melt flow 11 directed toward a center of the growing single crystal. The axial position of the neutral surface of the CUSP magnetic field above the surface of the melt makes a crucial contribution to the melt flow 11 reaching the center in a focused way, i.e. having a radius that is substantially less than the radius of the single crystal when it reaches the center. Other preferred features of the pulling device are a static bottom heater 7 by which an outer-lying region of the bottom of the crucible is heated, and a heat exchanger 1 surrounding the single crystal and preferably cooled with water and blackened on the inner surface, as well as an annular heater 3 by which an edge of the single crystal adjoining the melt is heated.

The lower edge of the heat exchanger (cooler) lies at a distance e from the lower edge of the heat shield, which is preferably in the range of from 40 to 200 mm. For the production of low-defect single crystals with high pulling rates (more than 0.5 mm/min), the distance preferably lies in the lower part of the range indicated. The distance f denotes the distance between the lower edge of the annular heater 3 and the lower edge of the heat shield 2. This distance is preferably from 10 to 30 mm. The lower edge of the heat shield 2 lies at a distance g of preferably 10 to 50 mm from the free melt surface. The greater the amount of heat supplied by the annular heater, the smaller this distance can be kept. With the aid of the annular heater 3 and the heat exchanger 1, the heat budget can be controlled expediently and adapted to the thermal conditions which vary during the pulling process.

Example

A plurality of single crystals of silicon were pulled under various conditions and processed further to form semiconductor wafers having a diameter of 300 mm. The subsequently examined semiconductor wafers came from various cylindrical crystal positions, the transition from an initial cone to the cylindrical part of the single crystal having been defined as the zero position. Three groups of specimens were formed overall, for each of which the respective process parameters did not differ substantially except for the position of the neutral surface of the magnetic field.

A device having the features according to FIG. 4 was used for pulling the single crystals, but without the mobile bottom heater 4 in the case of the slowly pulled single crystals and without the annular heater 3 in the case of the rapidly pulled single crystals. The crystal and crucible rotations were both co-rotatory.

Examining the semiconductor wafers which were taken showed the presence of A-Swirl defects (LPITs) and FPDs (flow pattern defects) in all cases. Such defects were detected by etching the specimens and subsequent microscopic examination. For the specimens in which an oxygen concentration of less than 5.8 E17 atoms per cm$^3$ was adjusted with the aid of the crucial process parameters, there were actually no OSF defects. Specimen P3 had for example an oxygen content of 4.6 E17 atoms/cm$^3$, with a radial variation of 0.6% and a resistivity of 10 Ohmcm (radial variation 1.1%) and was without detectable oxidation induced stacking faults (OSF).

The examination in relation to the presence of COP defects with a diameter of more than 30 nm was carried out in two ways: By IR light scattering analysis with a meter of the MO-6 type from Mitsui Mining and Smelting, and by electrochemical Cu decoration (DSOD). As revealed by comparative measurements, MO-6 and DSOD correlate. Before carrying out the measurement, disk-shaped specimens were taken from the polished semiconductor wafers, with a diameter corresponding to the radius of the semiconductor wafers. The position where the specimens were taken is shown by FIG. 2. Since the process conditions when producing the single crystals were essentially the same for each specimen group, except for the position of the neutral surface of the magnetic field, the effect of displacing the neutral surface on the defect formation can be shown directly.

Figure 5:
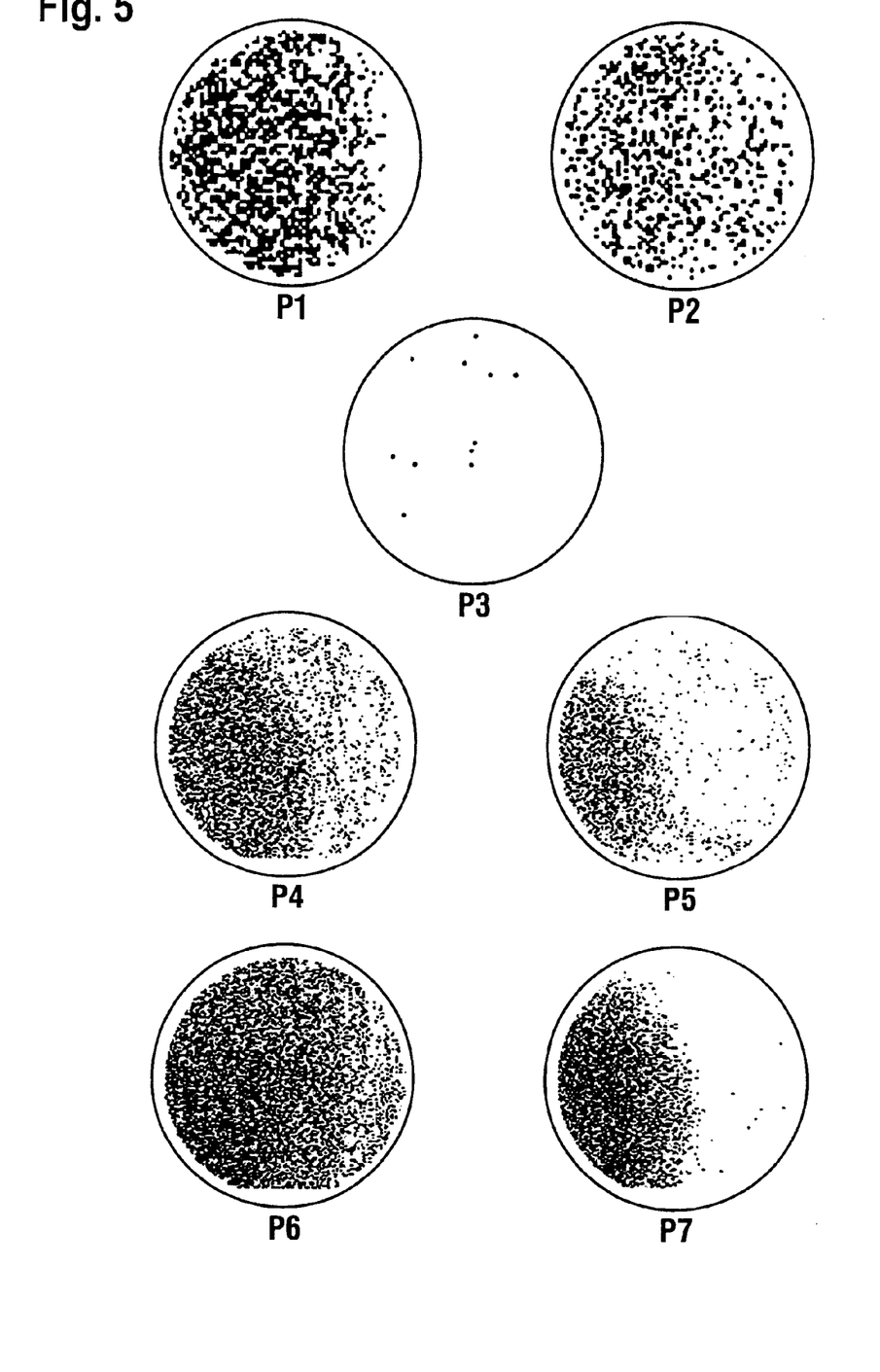
FIG. 5 depicts COP defects in wafer specimens P1-P7 prepared as described in the Examples.

Specimens P1 to P3 of the first group came from slowly pulled single crystals. Specimens P1 and P2 show a region at the center, in which COP defects made visible by means of DSOD are common, while such a region was no longer detected in the case of specimen P3. Only isolated preparation artifacts can be seen. The defect images of these specimens and further specimens P4 to P7 are highlighted in FIG. 5.

Only in the case of specimen P3 did the point of intersection of the neutral surface of the CUSP magnetic field lie at +9 cm above the surface of the melt and therefore in the range according to the invention. For the other two specimens P1 and P2, the axial position of the neutral surface lay in the melt (−16 cm) or slightly below the surface of the melt (−1.4 cm). The effect achieved by raising the position of the neutral surface of the magnetic field was that the defect-free component of the surface of the semiconductor wafer increased significantly. This effect is exhibited even with high pulling rates, as revealed by the following examples.

For the production of further single crystals, the effect of the heat exchanger was enhanced by positioning it closer to the phase boundary. Owing to the concomitant increase in the temperature gradient G, the pulling rate V could also be increased. The defect images of the specimen group P4 and P5, based on MO-6 measurements, show a lower homogeneity of G(r). A corresponding reduction of the COP defects in the central region was therefore achieved only by increasing the distance from the neutral surface of the magnetic field to the surface of the melt from +12 cm (specimen 4) to +14 cm (specimen 5).

When pulling the single crystals for the third group (specimen 6 and specimen 7), the use of the annular heater was obviated in favor of a larger distance g between the heat shield and the surface of the melt. At the same time, a more powerful heat exchanger was arranged at a short distance e from the lower edge of the heat shield in order to increase the gradient G. In this way, the pulling rate V could be increased further. However, an increased need for homogenization of the gradient G(r) was found. The power of the mobile heat source was increased, in order to deliver more heat to the center of the phase boundary. As shown by the defect images based on MO-6 measurements, only increasing the distance from the neutral surface of the magnetic field to the surface of the melt from +10.5 cm (specimen 6) to +11.5 cm (specimen 7) leads to a significant reduction of the COP defect zone.

The average values of the most important process parameters when pulling the single crystals and the defect images of specimens P1 to P7 are summarized in the following table.

Comparing the defect images shows that in all cases, a high position of the neutral surface of the magnetic field leads to a significant reduction of the COP defect region at the center of the semiconductor wafer.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A method for producing semiconductor wafers of silicon having a diameter of 300 mm or more, comprising pulling of a single crystal from a melt contained in a crucible having side walls and a bottom, and slicing semiconductor wafers from the pulled single crystal, comprising growing a single crystal and delivering heat to a center of the growing single crystal at a boundary with the melt during the pulling of the single crystal, and applying a CUSP magnetic field to the melt such that a neutral surface of the CUSP magnetic field intersects a pulling axis of the single crystal at a distance of at least +50 mm above a surface of the melt; providing a lateral heat source surrounding the crucible, an annular heat source above the melt surface surrounding the single crystal, a static heat source which is arranged statically below the crucible, and a mobile heat source at the crucible bottom which is raised with the crucible while the single crystal is being pulled; and dividing a heating power between the heat sources.

2. The method of claim 1, wherein the neutral surface of the CUSP magnetic field intersects the pulling axis of the single crystal at a distance of +50 to +150 mm above the surface of the melt.

3. The method of claim 1, further comprising pulling the single crystal with a ratio V/G such that neither A-swirl defects nor crystal originated particles (COP defects) with a diameter greater than 30 nm are created on at least 75% of a

| Crystal specimen | P1 | P2 | P3 | P4 | P5 | P6 | P7 |
| --- | --- | --- | --- | --- | --- | --- | --- |
| Crystal position [mm] | 450 | 420 | 450 | 220 | 210 | 400 | 380 |
| (a) Pulling rate [mm/min] | 0.38 | 0.38 | 0.38 | 0.57 | 0.57 | 0.72 | 0.71 |
| (b) Crystal rotation [rpm] | 8.5 | 8.5 | 8.5 | 7.2 | 7.2 | 8 | 8 |
| (c) Crucible rotation [rpm] | 4 | 4 | 4 | 3 | 3 | 4 | 4 |
| (d) Position of the neutral surface of the magnetic field [cm] | −16 | −1.4 | +9 | +12 | +14 | +1.5 | +11.5 |
| (e) Distance from cooler-lower edge of heat shield [mm] | 195 | 195 | 195 | 45 | 45 | 45 | 45 |
| (f) Distance from ring heater-lower edge of heat shield [mm] | 24 | 24 | 24 | 24 | 24 | — | — |
| (g) Distance from lower edge of heat shield-melt [mm] | 35 | 35 | 35 | 25 | 25 | 50 | 50 |
| Power of ring heater [kW] | 10 | 10 | 10 | 12 | 12 | 0 | 0 |
| Power of crucible bottom heater [kW] | 0 | 0 | 0 | 4 | 4 | 7 | 7 |
| Defect image (COP measurement)(See FIG. 5) |  P1 |  P2 |  P3 |  P4 |  P5 |  P6 |  P7 | surface of the semiconductor wafers, V denoting a pulling rate and G denoting an axial temperature gradient at the boundary between the single crystal and the melt.

4. The method of claim 2, further comprising pulling the single crystal with a ratio V/G such that neither A-swirl defects nor crystal originated particles (COP defects) with a diameter greater than 30 nm are created on at least 75% of the surface, V denoting a pulling rate and G denoting an axial temperature gradient at the boundary between the single crystal and the melt.

5. The method of claim 1, further comprising controlling incorporation of oxygen into the single crystal such that no oxidation induced stacking faults (OSF defects) can be detected in the semiconductor wafers.

6. The method of claim 3, further comprising controlling incorporation of oxygen into the single crystal such that no oxidation induced stacking faults (OSF defects) can be detected in the semiconductor wafers.

7. The method of claim 1, wherein the single crystal and the crucible are co-rotated, the single crystal being rotated more rapidly than the crucible.

8. The method of claim 1, wherein heat is extracted from the single crystal by cooling in a temperature range relevant for a nucleation of vacancy aggregates.

9. The method of claim 1, wherein an edge of the single crystal, adjoining the surface of the melt, is heated.

10. The method of claim 1, wherein the semiconductor wafers have a diameter of 300 mm and the single crystal is pulled at a rate of at least 0.35 mm/min.

11. A furnace for pulling a single crystal from a melt contained in a crucible, comprising magnetic coils which generate a CUSP magnetic field having a neutral surface that intersects a pulling axis of the single crystal at a distance of at least 50 mm above a surface of the melt, the furnace having a cavity therein for receiving a quartz crucible for containing a melt of silicon, a lateral heat source surrounding the crucible, an annular heat source positioned above the melt surface so as to surround a crystal being pulled from the melt, a static heat source positioned below the crucible, and a mobile heat source below a bottom of the crucible which raises as the crucible is raised, and a heating power divided between the heat sources.

12. The device of claim 11, having a cooling heat exchanger with a blackened inner surface surrounding the single crystal positioned above the annular heat source.

13. The device of claim 11, having a heat shield, screening the single crystal, with a lower edge which lies at a distance of 10 to 50 mm from a surface of the melt.

* * * * *